US007012473B1

(12) United States Patent
Kokolakis

(10) Patent No.: US 7,012,473 B1
(45) Date of Patent: Mar. 14, 2006

(54) CURRENT STEERING CHARGE PUMP HAVING THREE PARALLEL CURRENT PATHS PREVENTING THE CURRENT SOURCES AND SINKS TO TURN OFF AND ON

(75) Inventor: Ioannis Kokolakis, Athens (GR)

(73) Assignee: Athena Semiconductors, Inc., Fremont, CA (US)

( * ) Notice: Subject to any disclaimer, the term of this patent is extended or adjusted under 35 U.S.C. 154(b) by 56 days.

(21) Appl. No.: 10/622,330

(22) Filed: Jul. 17, 2003

Related U.S. Application Data

(60) Provisional application No. 60/396,314, filed on Jul. 17, 2002.

(51) Int. Cl.
*H03L 7/093* (2006.01)
*G05F 3/02* (2006.01)

(52) U.S. Cl. .............................. 331/17; 331/25; 331/16; 327/536; 327/148; 327/157; 375/374

(58) Field of Classification Search .................. 331/16, 331/17, 25, 15; 327/157, 148, 536, 543; 375/374
See application file for complete search history.

(56) References Cited

U.S. PATENT DOCUMENTS

| 5,760,640 | A  | * | 6/1998  | Girard et al. ............... 327/543 |
| 6,124,755 | A  | * | 9/2000  | Parker et al. ............... 327/543 |
| 6,169,458 | B1 | * | 1/2001  | Shenoy et al. ................ 331/17 |
| 6,181,210 | B1 |   | 1/2001  | Wakayama .................... 331/8 |
| 6,278,332 | B1 |   | 8/2001  | Nelson et al. ................ 331/17 |
| 6,326,852 | B1 | * | 12/2001 | Wakayama ................... 331/17 |
| 6,664,829 | B1 | * | 12/2003 | Hughes ...................... 327/157 |
| 2002/0105388 | A1 |  | 8/2002 | Delmot et al. ................ 331/17 |
| 2002/0175723 | A1 |  | 11/2002 | Ruegg et al. ............... 327/157 |
| 2003/0076141 | A1 |  | 4/2003 | Hsu et al. .................... 327/157 |
| 2003/0107419 | A1 |  | 6/2003 | Park .......................... 327/157 |

OTHER PUBLICATIONS

Rhee, Woogeun, *Design of High-Performance CMOS Charge Pumps in Phase-Locked Loops*, IEEE 1999.

* cited by examiner

*Primary Examiner*—Joseph Chang
(74) *Attorney, Agent, or Firm*—Sawyer Law Group LLP

(57) ABSTRACT

A current steering charge pump that receives control signals and sources and sinks current in response to the control signals. One embodiment includes a main current source, secondary current source, main current sink, and secondary current sink, and three different current paths between various of the current sources and current sinks. One embodiment includes buffers operative to maintain the node voltages of central nodes at the same voltage as the output node of the charge pump, where each buffer is coupled between two of the three current paths.

28 Claims, 3 Drawing Sheets

CURRENT STEERING CHARGE PUMP HAVING THREE PARALLEL CURRENT PATHS PREVENTING THE CURRENT SOURCES AND SINKS TO TURN OFF AND ON

CROSS-REFERENCE TO RELATED APPLICATIONS

The present application claims the benefit of U.S. Provisional Patent Application No. 60/396,314, filed Jul. 17, 2002, entitled, "Current Steering Charge Pump with Double Current Sources Unity Gain Buffers and Replica," which is incorporated herein by reference in its entirety.

FIELD OF THE INVENTION

The present invention relates to charge pump electrical circuits, and more particularly to charge pump circuits provided for phase-locked loop applications.

BACKGROUND OF THE INVENTION

Phase-locked loops (PLLs) are closed-loop phase control systems provided in electrical circuits and used in a wide variety of applications. A PLL compares the phase of an incoming reference clock signal to the phase of a periodic clock signal generated by an oscillator circuit and adjusts the periodic clock of the oscillator in both frequency and phase to the reference clock signal. PLLs are used in frequency synthesis, demodulation, clock recovery and distributions, etc. For example, in RF communication systems such as cellular phones, PLLs provide a stable and well-defined signal for the local oscillator to allow compliance with requirements of particular communication standards.

A particular type of PLL that offers some advantages over other types of PLLs is the charge pump PLL. Some advantages of this type of PLL include a higher frequency range of operation, low cost, and superior noise immunity and tracking capability. A typical charge pump PLL includes a phase/frequency detector (PFD) for detecting the difference in phase and frequency between the reference clock input and a feedback clock input from the oscillator, and for generating control signals, which are then passed to the charge pump. The PFD, for example, generates a control signal such as a pump up signal if the reference clock signal leads the oscillator clock, and/or a pump down signal if the reference clock lags the oscillator clock. The charge pump sources or sinks a particular amount of current (the pump current) to or from a connected loop filter according to the control signals. The loop filter develops a control voltage as the pump current is sourced or sunk, which causes a voltage controlled oscillator (VCO) to produce a higher or lower frequency clock. The VCO frequency is increased or decreased as appropriate to reduce the phase lead or lag of the inputs to the PFD, causing the PLL to "lock" to a specific output frequency, i.e., the VCO oscillates at a stable output phase and frequency. Ideally, when the PLL is locked, the charge pump causes corrections to the VCO phase and/or frequency only when the reference phase and/or frequency shifts.

The charge pump circuit of the PLL is critical for providing an accurate control current/voltage at a high speed. A simple charge pump circuit includes an "up" current source coupled between a high voltage supply (VDD) and an "up" switch to provide an output source current in response to a UP (pump up) signal from the PFD. The circuit also includes a "down" current sink coupled between a low voltage supply (VSS) and a "down" switch, which provide a sink current in response to a DN (pump down) signal from the PFD, and where the output of the charge pump is the node between the switches.

The source and sink current waveforms of a hardware implementation of a charge pump exhibit offset and glitch errors which cause the sink and source current waveforms to be asymmetrical. The asymmetry results in residual charge being left in the loop filter, producing a non-smooth control voltage and spur frequency tones in the output of the VCO. The offset and glitch errors are functions of the physical and electrical properties of semiconductor integrated circuit transistors and charge pumps.

Prior charge pumps have used current steering techniques with multiple current steering paths, or with a buffer and a single current steering path, to reduce offset or glitches. However, timing mismatch that occurs in the switches of these prior charge pump circuits causes the current source and/or current sink to easily turn off and produce large glitches in the output of the charge pump, thus producing a higher level of spurious emissions in the VCO output. Furthermore, current amplitude mismatch of the current source and the current sink is exponentially increased at output voltages close to the supply voltages VDD and VSS, causing large spurious emissions at the VCO and effectively defining an output voltage range of the charge pump as the range where the spurious emissions are kept below the level of spurious emissions needed to comply with the requirements of particular communications standards.

SUMMARY OF INVENTION

The invention provides a current steering charge pump and method therefor. In one aspect, a charge pump receives control signals and sources and sinks current in response to the control signals. The charge pump includes a main current source, a secondary current source, a main current sink, a secondary current sink, and three current paths provided between the current sources and the current sinks. A first current path and an output node are provided between the main current source and the main current sink, a second current path is provided between the main current source and the secondary current sink, and a third current path is provided between the secondary current source and the main current sink.

In another aspect, a charge pump receives control signals and sources and sinks current in response to the control signals, and includes a current source and a current sink. At least three current paths are provided between the current source and the current sink, where each of the current paths includes at least one switch, and where an output node is defined on one of the current paths and central nodes are defined on the other current paths. A plurality of buffers is included which are operative to maintain the node voltages of the central nodes at the same voltage as the output node, where each buffer is coupled between two of the three current paths.

In another aspect, a method for sourcing and sinking current in a charge pump in response to input control signals includes providing a current source and a current sink and three current paths between the current source and current sink, where an output node is defined between the current source and current sink on the first current path and a central node is defined on each of the second and third current paths. The output current is adjusted at the output node based on the input control signals, and the voltages at the central nodes of the second and third current paths are maintained at approximately the same voltage as the output node.

In another aspect, a method for sourcing and sinking current in a charge pump in response to input control signals includes providing a main current source, a secondary current source, a main current sink, and a secondary current sink. Three current paths are provided between the current sources and current sinks, where a first current path and an output node are provided between the main current source and the main current sink, a second current path is provided between the main current source and the secondary current sink, and a third current path is provided between the secondary current source and the main current sink. The output current is adjusted at the output node based on input control signals.

The present invention provides a charge pump that can provide output substantially free of glitches and DC offset. Multiple current steer branches, multiple current sources, and buffers in various embodiments allow minimization of timing mismatch and glitch errors from the charge pump. Furthermore a replica portion of the circuit can allow minimization of current mismatch in a wider range of output voltage.

DETAILED DESCRIPTION OF PREFERRED EMBODIMENTS

The present invention relates to a current steering charge pump and method therefor. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Embodiments and examples of the present invention are described below. While particular applications and methods are explained, it should be understood that the present invention can be used in a wide variety of other applications and with other techniques within the scope of the present invention.

Figure 1:
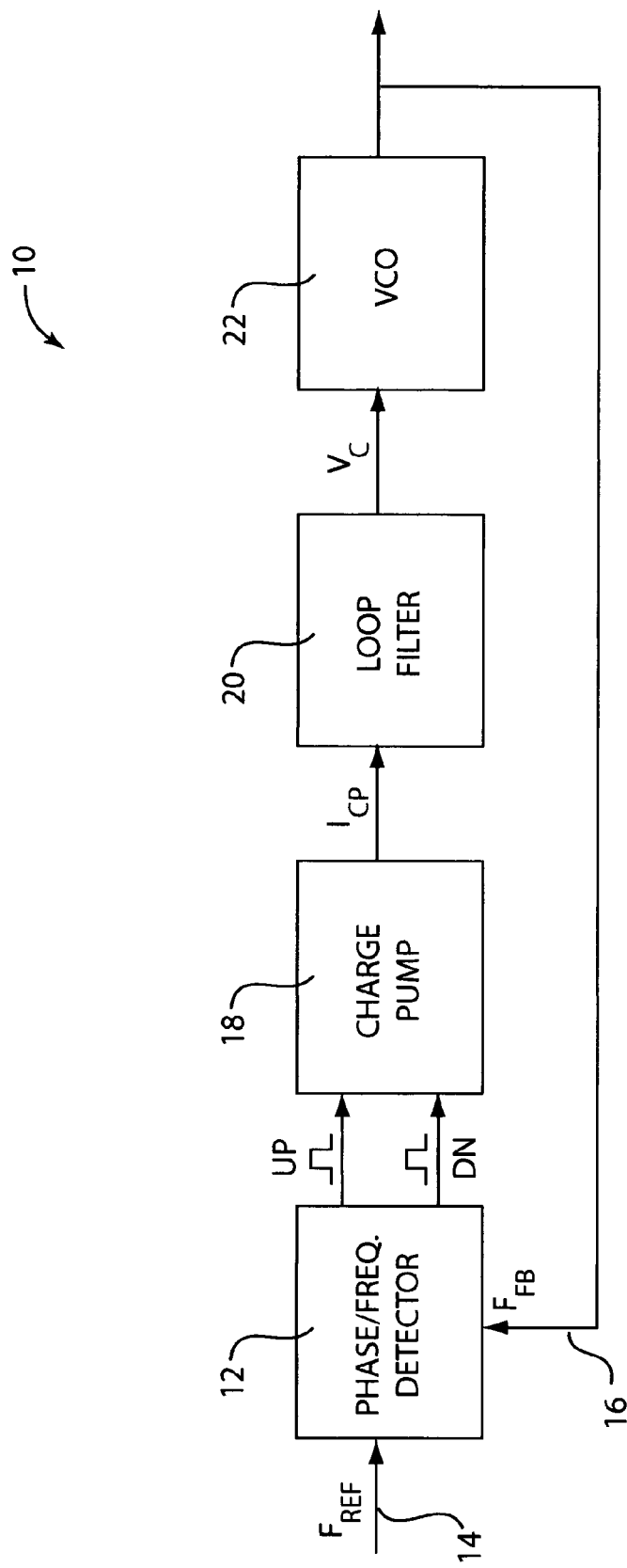
FIG. 1 is a block diagram of a charge pump phase-locked loop including a charge pump of the present invention.

FIG. 1 is a block diagram illustrating one example of a charge pump phase-locked loop (PLL) 10 including a charge pump of the present invention. PLL 10 includes a phase/frequency detector (PFD) 12 for detecting the difference in phase and frequency between a reference clock input 14 and a feedback clock input 16 and generating control signals indicative of whether the feedback phase leads or lags the reference phase and/or whether the feedback frequency should be increased or decreased to track the reference phase. For example, an UP control signal can be produced by the PFD 12 to indicate that the frequency of the feedback signal should be increased, and a DN control signal can be produced to indicate that the frequency of the feedback signal should be decreased. When the reference clock signal phase leads the VCO clock signal phase, the frequency of the VCO clock should be increased, the UP signal is at a high level, and the DN signal is at a zero or low level, and vice-versa for when reference clock phase lags the VCO clock phase and the frequency should be decreased. The UP and DN signals are both high at the end of each phase comparison cycle as a "dead zone" time to prevent non-linearity in the simultaneous operation of PFD 12 and charge pump 18. During the dead zone time, the charge pump output current is ideally zero to prevent spur frequency generation from the VCO.

The control signals (e.g., UP and DN) are passed to charge pump 18 of the present invention, which sources and/or sinks an amount of pump current at the output node of the charge pump in response to the control signals received from the phase detector 12. The operation of the charge pump 18 is described in greater detail below with respect to FIGS. 2 and 3.

The output pump current of the charge pump is provided to a loop filter 20, which generates a control voltage from the charge pump current and may reduce high frequency noise. The control voltage output by the loop filter 20 is provided to a voltage controlled oscillator (VCO) 22, which oscillates at a higher or lower frequency based on the control voltage level. The VCO 22 stabilizes when the reference and feedback clocks are at the same phase and frequency. The output of the VCO 22 provides the basis of the feedback clock 16, and therefore the feedback clock 16 is increased or lowered in frequency based on the control voltage. The feedback clock is synchronized with the reference clock in this way. The feedback clock can be divided down or otherwise modified as desired to fit the specifications of a particular application. The output of the VCO 22 is the output of the PLL 10.

The PLL 10 can correct large and small phase and frequency discrepancies through its adjustment process, thus causing a signal's phase to track very closely with a desired phase. Although a PLL is described above for use with the charge pump of the present invention, other types of circuits and devices can also use the charge pump for a current output and current adjustment based on input control signals.

Figure 2:
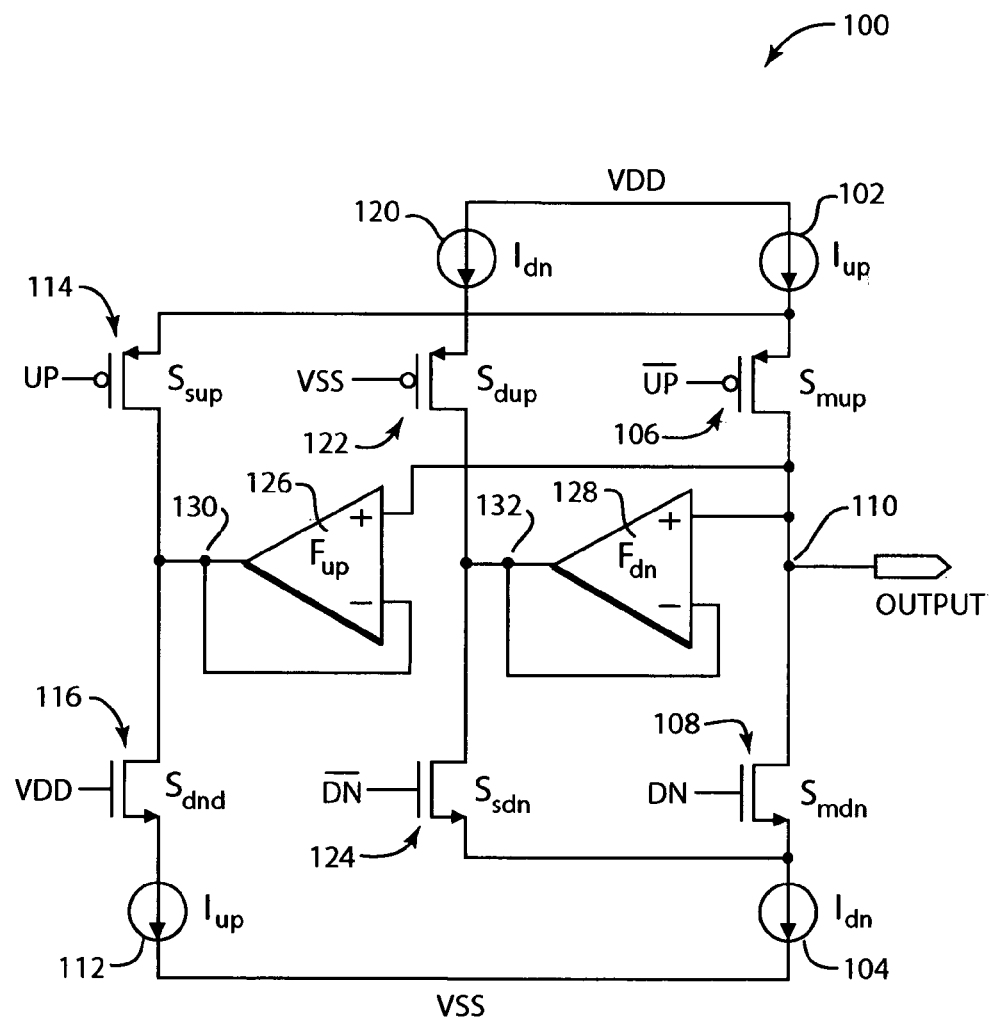
FIG. 2 is a schematic diagram illustrating a first embodiment of the charge pump of the present invention.

FIG. 2 is a schematic diagram of an example of a first embodiment 100 of the present invention of the charge pump 18 of FIG. 1. The charge pump 100 includes three parallel current paths (including a main output path and two steering paths), two current sources, and two current sinks.

In the described embodiment, a main current source $I_{up}$ 102, a main current sink $I_{dn}$ 104, a secondary current source $I_{dn}$ 120, and a secondary current sink $I_{up}$ 112 are provided. The current sources are adjustable "pump up" sources used to source the pump current output by the charge pump, and the current sinks are adjustable "pump down" current sources used to sink the pump current output by the charge pump. A high voltage supply VDD is provided at the current sources, while a low voltage supply VSS, usually denoted as ground, is provided at the current sinks, which supplies a lower voltage than VDD.

The main current path lies between the main current source 102 and the main current sink 104 and includes an upper switch element $S_{mup}$ 106 connected in series to a lower switch $S_{mdn}$ 108 with their common node 110 defining the output node 110 of the charge pump. Upper switch element 106 has an inverse UP signal input to its control node (the UP signal being from the PFD 12 of FIG. 1). Lower switch element 108 has a DN signal from the PFD 12 input to its control node.

Two other current steering paths are also provided in addition to the main current path. One steering path lies between the main current source 102 and the secondary current sink 112 and includes an upper steering switch element $S_{sup}$ 114, which is preferably identical to the upper switch element 106, connected in series with a dummy lower switch element $S_{dnd}$ 116, which is preferably identical to lower switch element 108. Upper switch element 114 has an UP signal from the PFD 12 input to its control node, and dummy lower switch element 116 has the VDD voltage signal connected to its control node so that the switch is always on, i.e. switch closed to allow current to pass.

The second steering path lies between the secondary current source 120 and main current sink 104 and includes a dummy upper switch element $S_{dup}$ 122, which is preferably identical to upper switch element 106, connected in series with a lower steering switch element $S_{sdn}$ 124, which is preferably identical to lower switch element 108. Dummy upper switch element 122 has the VSS supply connected to its control node so that it always allows current to pass, and lower switch element 124 has an inverse DN signal input to its control node.

The switches of the circuits can be implemented as MOS transistors, BJT transistors, or any other type of electrical or electronic switching component. For example, in one embodiment, each upper switch may include a P-channel MOS transistor, while each lower switch may include an N-channel MOS transistor. The switches can also be implemented by two complementary MOS transistors connected in parallel thus by one n-channel MOS and one p-channel MOS connected in parallel with the appropriate UP and DN signal arrangement in each switch.

Feedback elements $F_{up}$ 126 and $F_{dn}$ 128 are preferably amplifiers connected as unity gain buffers that keep the same potential between the output node 110 and central nodes of the steering paths, respectively. Feedback element 126 is connected between the output node 110 and a common node 130 of upper and lower switches 114 and 116 of the first current steering path, where common node 130 is the central node of this steering path. Feedback element 128 is connected between the output node 110 and a common node 132 of upper and lower switches 122 and 124 of the second current steering path, where node 132 is the central node of this steering path.

In operation, if the UP signal is high, the upper switches let the current of the main current source 102 pass differentially through the main path to the output 110 (when the DN signal is low), thus sourcing the pump current to the output, or through the main path to the main sink 104 (when the DN signal is high), giving a zero current to the output. If the UP signal is low, the current from the main current source 102 can pass through the first steering path to the secondary current sink 112, thus allowing the main current source 102 to always stay on.

If the DN signal is high, the lower switches allow the current of the main current sink 104 pass differentially through the main path from the output 110 (if the UP signal is low), thus sinking the pump current from the output, or through the main path from the main current source (if the UP signal is high). If the DN signal is low, the current of the main current sink 104 can pass through the second steering path from the secondary current source 120, thus allowing the main current sink 104 to always stay on.

The dummy switches 116 and 122 always let the current pass therethrough. In this way, the secondary current source 120 and secondary current sink 112 allow the main current source 102 and the main current sink 104 to always be turned on, preventing the current sources and sinks to turn off and on in each phase compare cycle, thus minimizing the switch time of the charge pump and preventing the glitches caused by the switching action of current sources and sinks.

Unity gain buffer 126 keeps central node 130 at the same voltage as output node 110, and unity gain buffer 128 keeps central node 132 at the same voltage as output node 110 (i.e., the unity gain buffer 126 keeps nodes of two upper switches at the same voltage, while the unity gain buffer 128 keeps nodes of two lower switches at the same voltage). The voltage difference applied at the upper switches of the main path and the steering path is the same, and the voltage difference applied at the lower switches of the main path and the steering path are also the same. In this way, the switches operate at the same conditions, thus minimizing the glitches produced by their switching action and ensuring that the sink and source waveforms are symmetrical.

The speed of the charge pump 100 is potentially high and depends only on the speed of the switches. In high-speed PLLs, the existence of timing mismatch between non-ideal switches can produce high spurs in the PLL. By providing the same voltage at the central nodes as at the output node, the unity gain buffers 126 and 128 ensure that the main current source 102 and the main current sink 104 are not turned off due to timing mismatch from the upper switches or lower switches (provided the UP signal has a small timing mismatch with the inverse UP signal, and the DN signal has a small timing mismatch with the inverse DN signal). Therefore, any glitches produced when current sources and sinks are turned off and on are reduced or eliminated due to the fact that the main current source 102 and sink 104 of the present invention are never turned off.

When a large timing mismatch occurs between UP and inverse UP, or DN and inverse DN, then at the time period of the switching from the main current path to the steering path, or at the time period of switching from the steering current path to the main path, there is an amount of time that the switches 114 and 106 or 124 and 108 are both opened, and thus the main source 102 or main sink 104 are not connected to any current path and start to switch off. Provided that source 102 and sink 104 need a lot of time to switch off and are much slower than the switching elements, the time frame of the mismatch between UP and inverse UP and DN and inverse DN can be kept to reasonable levels. The two steering paths, one for current source 102 and one for current sink 104, ensure that any timing mismatch between the up switches 114 and 106 does not affect the sink 104 and that any timing mismatch between the DN switches 124 and 108 does not affect the source 102. In contrast, prior charge pumps with one steering path suffer greatly at high speeds from this and large glitches are produced when both source and sink current sources switch off and switch on at the same time, requiring an almost perfect match between UP and inverse UP, between DN and inverse DN, and between all the steering switches.

Dummy switch elements 122 and 116 provide symmetry between the main path and the steering paths. The main path and each steering path have the same number and type of switch elements, so that the central (output) node of the main path and the central nodes of the steering paths are equally balanced in number and type of switches. This symmetry of the circuit allows symmetry of the source and sink currents. In an alternate embodiment, the dummy switch elements of the steering paths can be changed to steering switch elements, and the steering switch elements can be changed to dummy switch elements, with an appropriate change in the control signals of each. For example, the switch 122 can become a steering switch element controlled by the DN signal, while the switch 124 becomes a dummy switch element with its control node coupled to VDD. The switch 116 can become a steering switch element controlled by the inverse UP signal, while the switch 114 becomes a dummy switch element having its control node coupled to VSS. This arrangement of the switches is less effective than the embodiment described in FIG. 2, since the switches that perform the steering of the up and down currents can be of different types (one is n-channel and the other p-channel MOS), and thus need accurate matching in order not to cause the main current source 102 or sink 104 to switch off. An advantage of this alternate embodiment is that the charge pump is controlled only by the inverse UP signal and the DN signal, providing equal loading to the PFD output and better matching between rise and fall times of the PFD signals. Almost equally-timed switching can be provided when the switches are implemented by one n-channel MOS and one p-channel MOS connected in parallel.

Furthermore, the fact that the source and/or sink currents are always flowing in the main path or in steering paths, and are not switched on or off, maintains the stability of the current consumption of the charge pump, thus reducing or eliminating the power supply disturbances that are produced in previous charge pumps.

Figure 3:
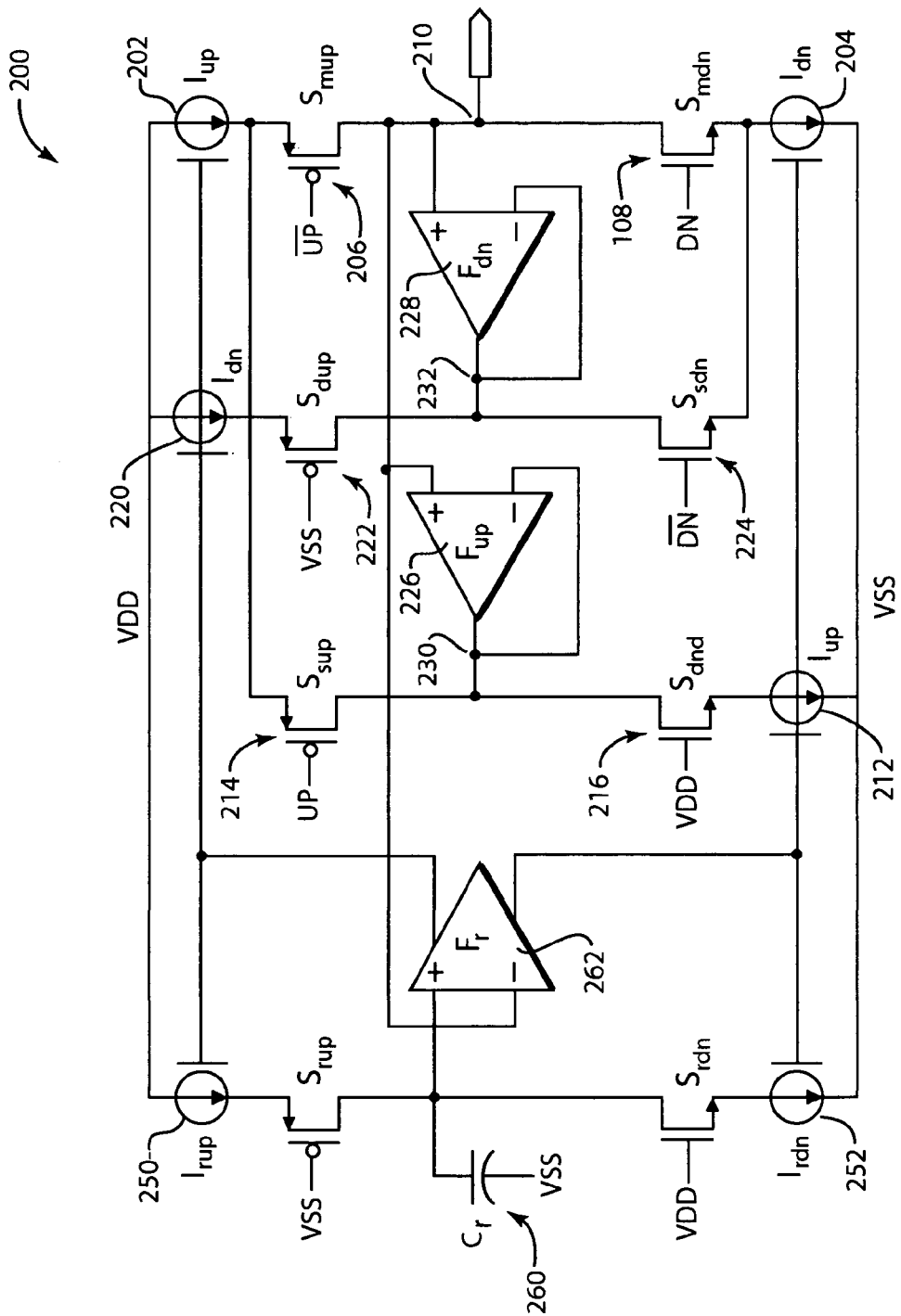
FIG. 3 is a schematic diagram illustrating a second embodiment of the charge pump of the present invention.

FIG. 3 is a schematic diagram of another embodiment 200 of the charge pump 18 of the present invention, where the present embodiment includes a replica circuit.

Charge pump 200 includes three parallel current paths, two current sources, and two current sinks, similar to the embodiment 100 of FIG. 2. Thus, charge pump 200 includes a main current source $I_{up}$ 202, a main current sink $I_{dn}$ 204, a secondary current source $I_{dn}$ 220, and a secondary current sink $I_{up}$ 212. The main current path lies between the main current source 202 and the main current sink 104 and includes an upper switch element $S_{mup}$ 206 connected in series to a lower switch $S_{mdn}$ 208 with their common node 210 defining the output node. Upper switch element 206 has an inverse UP signal input to its control node, and lower switch 108 has a DN signal input to its control node.

The two steering paths include one steering path between the main current source 202 and the secondary current sink 212, which includes an upper steering switch element $S_{sup}$ 214 connected in series with a dummy lower switch $S_{dnd}$ 216. Upper switch element 214 has the UP signal input to its control node, and dummy lower switch element 216 has the VDD voltage connected to its control node. The other steering path lies between the secondary current source 220 and main current sink 204 and includes a dummy upper switch $S_{dup}$ 222 connected in series with a lower steering switch element $S_{sdn}$ 224. Dummy upper switch element 222 has the VSS supply connected to its control node, and lower switch element 224 has an inverse DN signal input to its control node. These switch elements and current paths are similar to those described above with reference to FIG. 2. The switch and dummy elements can be arranged in an alternate embodiment similarly as described above for FIG. 2.

Similar to charge pump 100 of FIG. 1, charge pump 200 also includes feedback elements $F_{up}$ 226 and $F_{dn}$ 228 (unity gain buffers), where feedback element 226 is connected between the output node 210 and common node 230 of upper and lower switches 214 and 216 of one current steering path. Feedback element 228 is connected between the output node 210 and a common node 232 of upper and lower switches 222 and 224 of the other current steering path.

The operation of this portion of charge pump 200 is similar to the operation of pump 100 of FIG. 2.

Charge pump 200 also includes a replica portion. The replica circuit replicates the voltage at the output node at another circuit branch so that the amount of pump current from the main current source and the amount of pump current from the main current sink are more closely matched and the output voltage range of the charge pump is increased.

A mirror of the main current path called a replica path lies between a replica current source $I_{rup}$ 250 and a replica current sink $I_{rdn}$ 252 and includes an upper dummy switch $S_{rup}$ 254 connected in series to a lower dummy switch $S_{rdn}$ 256, and where their common node defines a replica node 258. The upper dummy switch 254 has the VSS voltage connected to its control node, and the lower dummy switch 256 has the VDD voltage connected to its control node, and thus these dummy switches always let the current pass from source to sink. In the described embodiment, for example, the upper dummy switch 254 can be a P-channel transistor and the lower dummy switch 256 can be an N-channel transistor. Other types of transistors or other types of switches can be used in other embodiments.

A capacitor $C_r$ 260 is connected between the replica node 258 and the VSS supply voltage. Capacitor 260 provides stability and by matching to the capacitor in the loop filter that follows the charge pump, voltage changes of the replica node 258 follow the output node 210 connected to the loop filter.

A replica feedback element $F_r$ 262 is also included in the charge pump 200, and is preferably an amplifier. The two differential inputs of replica feedback element 262 are connected to the replica node 258 and the output node 210, respectively, while the two differential outputs of the feedback element 262 control the current amplitude of the current sources and current sinks, where the positive differential output is connected to the current sources 202, 220, and 250, and the negative differential output is connected to the current sinks 204, 212, and 252.

When the output node 210 achieves a higher voltage than the replica node 258, the replica feedback element 262 increases the amplitude of the current sources 202, 220, and 250, and decreases the amplitude of the current sinks 204, 212, and 252. When the output node 210 achieves a lower voltage than the replica node 258, the replica feedback element 262 decreases the amplitude of the current sources 202, 220, and 250, and increases the amplitude of the current sinks 204, 212, and 252. This adjustment keeps the amplitude of the current source and sink equal, thus reducing the current amplitude mismatch of the main current source 202 and the main current sink 204. For example, such a mismatch can occur when the voltage at the output node 110 goes very high, close to the VDD supply voltage, and the main current source 202 degrades (i.e., the up current goes lower) while the main current sink 204 remains constant. Or, the voltage at the output node may go very low, close to the VSS voltage, and the main current sink 204 degrades (i.e., the down current goes lower) while the main current source 202 remains constant. The current amplitude mismatch produces in the PLL a large timing mismatch between the UP and DN signals of the phase frequency detector 12 of FIG. 1 and a continuous offset at the period of dead zone that is the main cause of spurious emissions. In the present invention, the source and sink current amplitude mismatch is eliminated, thus minimizing DC offsets at the output of the charge pump 200 in a wider voltage control range and reducing spurious emissions of the VCO 22. This, in turn, allows an increased output voltage range of the charge pump.

The present invention provides several advantages, including a very high switching speed, elimination of glitch errors, elimination of current mismatch, and elimination of power supply disturbances. More specifically, the charge pump of the present invention minimizes timing mismatch at the charge pump by the addition of two current steering branches and two feedback elements that keep the switching elements at the same conditions. Furthermore, there is a minimization of current amplitude mismatch by the addition of replica circuitry, and thus minimization of spurious emissions of the VCO and a wider control voltage range at the PLL.

Although the present invention has been described in accordance with the embodiments shown, one of ordinary skill in the art will readily recognize that there could be variations to the embodiments and those variations would be within the spirit and scope of the present invention. The techniques of the present invention can be applied to many types of alarms and similar conditions. Accordingly, many modifications may be made by one of ordinary skill in the art without departing from the spirit and scope of the appended claims.

What is claimed is:

1. A charge pump for receiving control signals, the charge pump sourcing and sinking current in response to the control signals, the charge pump comprisng:
    a main current source;
    a secondary current source;
    a main current sink;
    a secondary current sink;
    three current paths provided between the current sources and the current sinks, wherein a first current path and an output node is provided between the main current source and the main current sink, a second current path is provided between the main current source and the secondary current sink, and a third current path is provided between the secondary current source and the main current sink wherein each of the three parallel current paths includes at least one switch, wherein three current paths are parallel current paths, and wherein each of the three current paths includes an upper switch connected in series with a lower switch, wherein the common node of the switches of the first current path defines the output node, wherein the common nodes of the switches of the second and third current paths define two central nodes, and further comprising first and second buffers operative to maintain the node voltages of the central nodes of the second and third current paths at the same voltage as the output node, each buffer coupled between two of the current paths.

2. The charge pump of claim 1 wherein the first and second buffers each have an input node coupled to the output node, and wherein the first and second buffers have output nodes coupled to the central nodes of the second and third current paths, respectively.

3. The charge pump of claim 1 wherein the first and second buffers each include an amplifier connected as a unity gain buffer.

4. The charge pump of claim 1 wherein each upper switch includes a P-channel transistor, and each lower switch includes an N-channel transistor.

5. The charge pump of claim 1 further comprising:
    a replica current source;
    a replica current sink;
    a replica current path and a replica node provided between the replica current source and the replica current sink, wherein the replica current path is parallel to the other current paths and includes at least one switch.

6. The charge pump of claim 5 wherein the replica current path includes an upper switch connected in series with a lower switch, the common nodes of the switches defining the replica node.

7. The charge pump of claim 6 further comprising a capacitor, wherein the replica node is coupled to a first node of the capacitor, and a second node of the capacitor is coupled to a low supply voltage.

8. The charge pump of claim 6 further comprising a replica feedback element operative to balance the currents in the current sources and current sinks.

9. The charge pump of claim 8 wherein the replica feedback element includes an amplifier, the amplifier having a first input coupled to the replica node and a second input coupled to the output node, the amplifier having a first output coupled to current amplitude control nodes of all the current sources, and the amplifier having a second output coupled to the current amplitude control nodes of all the current sinks.

10. The charge pump of claim 8, wherein a central node is provided on the each of the second and third current paths, and wherein the two buffers and the three parallel current paths, the replica feedback element, and the replica path adjust the current sources and current sinks in any combination to maintain the node voltage of the central nodes and the voltage of the output node at the same potential and to balance current amplitude of the current sources and current sinks so as to minimize DC offsets at the output.

11. A charge pump for receiving control signals, the charge pump sourcing and sinking current in response to the control signals, the charge pump comprising:
    a current source;
    a current sink;
    at least three current paths provided between the current source and the current sink, wherein each of the current paths includes at least one switch, wherein an output node is defined on one of the current paths and central nodes are defined on the other current paths; and
    a plurality of buffers operative to maintain the node voltages of the central nodes at the same voltage as the output node, wherein each buffer is coupled between two of the three current paths, wherein the plurality of buffers each have an input node coupled to the output node, and wherein one buffer has an output node coupled to a first one of the central nodes, and a different buffer has an output mode coupled to a second one of the central nodes, further comprising a secondary current source and a secondary current sink, wherein a first current path and the output node is provided between the main current source and the main current sink, a second current path is provided between the main current source and the secondary current sink, and a third current path is provided between the secondary current source and the main current sink, wherein the at least one switch for each of the current paths includes an upper switch connected in series with a lower switch, wherein the common node of the switches of one of the current paths defines an output node, and wherein the common nodes of the switches of the other current paths define central nodes.

12. The charge pump of claim 11 wherein the plurality of buffers each have an input node coupled to the output node, and wherein one buffer has an output node coupled to a first one of the central nodes, and a different buffer has an output node coupled to a second one of the central nodes.

13. The charge pump of claim 11 further comprising:
a replica current source;
a replica current sink;
a replica current path provided between the replica current source and the replica current sink, wherein the replica current path is parallel to the other current paths and includes an upper switch connected in series with a lower switch, the common nodes of the switches defining a replica node;
a capacitor, wherein the replica node is coupled to a first node of the capacitor, and a second node of the capacitor is coupled to a ground; and
a replica feedback element operative to balance the currents in the current sources and current sinks, the replica feedback element including an amplifier having a first input coupled to the replica node, a second input coupled to the output node, a first output coupled to current amplitude control nodes of the current sources, and a second output coupled to the current amplitude control nodes of all the current sinks.

14. A method for sourcing and sinking current in a charge pump in response to input control signals, the method comprising:
(a) providing a current source and a current sink and three current paths between the current source and current sink, wherein an output node is defined between the current source and current sink on the first current path and a central node is defined on each of the second and third current paths; and
(b) adjusting output current at the output node based on the input control signals; and
(c) maintaining the voltages at the central nodes of the second and third current paths at approximately the same voltage as the output node, wherein the current source and current sink are both turned on during sourcing output current and during sinking output current at the output node of the charge pump, further comprising providing a secondary current source and a secondary current sink, wherein the three current paths are parallel current paths, and wherein one current path is provided between the main current source and the main current sink, the second current path is provided between the main current source and the secondary current sink, and the third current path is provided between the secondary current source and the main current sink, wherein each of the three parallel current paths includes an upper switch connected in series with a lower switch, wherein the common node of the first current path defines an output node, and wherein the common nodes of the second and third current paths define two central nodes.

15. The method of claim 14 wherein the maintaining is performed using first and second buffers, wherein the first and second buffers each have an input node coupled to the output node, and wherein the first and second buffers have output nodes coupled to the central nodes of the second and third current paths, respectively.

16. The method of claim 14 further comprising balancing the currents of the current sources and the current sinks.

17. The method of claim 16 wherein the balancing of the currents is performed using a replica current path having a replica node provided between a replica current source and a replica current sink, and an amplifier.

18. The method of claim 17 wherein the amplifier has a first input coupled to the replica node and a second input coupled to the output node, the amplifier having a first output node coupled to current amplitude control nodes of all the current sources, and the amplifier having a second output node coupled to the current amplitude control nodes of all current sinks.

19. The method of claim 14 wherein the input control signals include UP, inverse UP, DN, and inverse DN control signals developed by a phase-frequency detector.

20. A method for sourcing and sinking current in a charge pump in response to input control signals, the method comprising:
(a) providing a main current source, a secondary current source, a main current sink, and a secondary current sink;
(b) providing three current paths between the current sources and current sinks, wherein a first current path and an output node is provided between the main current source and the main current sink, a second current path is provided between the main current source and the secondary current sink, and a third current path is provided between the secondary current source and the main current sink; and
(c) adjusting output current at the output node based on input control signals, wherein the three current paths are parallel current paths, and wherein each of the three current paths includes an upper switch connected in series with a lower switch, wherein the common node of the switches of the first current path defines the output node, and wherein the common nodes on the second and third current paths define the central nodes.

21. The method of claim 20 wherein an output node is defined between the main current source and main current sink on the first current path and a central node is defined on each of the second and third current paths and wherein the adjusting output current includes sourcing and/or sinking current at the output node.

22. The method of claim 21 further comprising maintaining the voltages at the central nodes of the second and third current paths at approximately the same voltage as the output node.

23. The method of claim 22 wherein the maintaining is performed using first and second buffers, wherein the first and second buffers each have an input node coupled to the output node, and wherein the first and second buffers have output nodes coupled to the central nodes of the second and third current paths, respectively.

24. The method of claim 20 further comprising:
providing a replica current source and a replica current sink; and
providing a replica current path and a replica node on the replica current path between the current source and the replica current sink, wherein the replica current path is parallel to the other current paths.

25. A charge pump for receiving control signals, the charge pump sourcing and sinking current in response to the control signals, the charge pump comprising:
a main current source;
a secondary current source;
a main current sink;
a secondary current sink;
three current paths provided between the current sources and the current sinks, wherein a first current path and an output node is provided between the main current source and the main current sink, a second current path is provided between the main current source and the secondary current sink, and a third current path is provided between the secondary current source and the main current sink, wherein each of the three parallel current paths includes at least one switch, further comprising a replica current source; a replica current sink; a replica current path and a replica node provided between the replica current source and the replica current sink, wherein the replica current path is parallel to the other current paths and includes at least one switch.

26. A method for sourcing and sinking current in a charge pump in response to input control signals, the method comprising:
(a) providing a current source and a current sink and three current paths between the current source and current sink, wherein an output node is defined between the current source and current sink on the first current path and a central node is defined on each of the second and third current paths; and
(b) adjusting output current at the output node based on the input control signals;
(c) maintaining the voltages at the central nodes of the second and third current paths at approximately the same voltage as the output node, wherein the current source and current sink are both turned on during sourcing output current and during sinking output current at the output node of the charge pump, further comprising providing a secondary current source and a secondary current sink, wherein the three current paths are parallel current paths, and wherein one current path is provided between the main current source and the main current sink, the second current path is provided between the main current source and the secondary current sink, and the third current path is provided between the secondary current source and the main current sink, wherein each of the three parallel current paths includes an upper switch connected in series with a lower switch, wherein the common node of the first current path defines an output node, and wherein the common nodes of the second and third current paths define two central nodes; and
(d) balancing the currents of the current sources and the current sinks, wherein the balancing of the currents is performed using a replica current path having a replica node provided between a replica current source and a replica current sink, and an amplifier.

27. The method of claim 26 wherein the amplifier has a first input coupled to the replica node and a second input coupled to the output node, the amplifier having a first output node coupled to current amplitude control nodes of all the current sources, and the amplifier having a second output node coupled to the current amplitude control nodes of all current sinks.

28. A method for sourcing and sinking current in a charge pump in response to input control signals, the method comprising:
(a) providing a main current source, a secondary current source, a main current sink, and a secondary current sink;
(b) providing three current paths between the current sources and current sinks, wherein a first current path and an output node is provided between the main current source and the main current sink, a second current path is provided between the main current source and the secondary current sink, and a third current path is provided between the secondary current source and the main current sink; and
(c) adjusting output current at the output node based on input control signals, further comprising:
providing a replica current source and a replica current sink; and
providing a replica current path and a replica node on the replica current path between the replica current source and the replica current sink, wherein the replica current path is parallel to the other current paths.

* * * * *